(12) United States Patent
Jurik et al.

(10) Patent No.: US 10,605,421 B2
(45) Date of Patent: Mar. 31, 2020

(54) DICHROIC PATTERNING FOR SUBTRACTIVE COLOR MIXING

(71) Applicant: Robe Lighting s.r.o., Roznov pod Radhostem (CZ)

(72) Inventors: Pavel Jurik, Prostredni Becva (CZ); Jan Vilem, Vsetin (CZ); Josef Valchar, Prostredni Becva (CZ)

(73) Assignee: Robe Lighting s.r.o., Roznov pod Radhostem (CZ)

( * ) Notice: Subject to any disclaimer, the term of this patent is extended or adjusted under 35 U.S.C. 154(b) by 4 days.

(21) Appl. No.: 16/113,898

(22) Filed: Aug. 27, 2018

(65) Prior Publication Data

US 2019/0056079 A1 Feb. 21, 2019

Related U.S. Application Data

(60) Provisional application No. 62/553,769, filed on Sep. 1, 2017.

(51) Int. Cl.

| F21S 10/00 | (2006.01) |
| G02B 5/20 | (2006.01) |
| G03F 7/00 | (2006.01) |
| F21V 9/40 | (2018.01) |
| F21V 14/00 | (2018.01) |

(Continued)

(52) U.S. Cl.
CPC .............. *F21S 10/007* (2013.01); *F21V 9/20* (2018.02); *F21V 9/40* (2018.02); *F21V 14/006* (2013.01); *G02B 5/205* (2013.01); *G02B 26/008* (2013.01); *G03F 7/0007* (2013.01);

(Continued)

(58) Field of Classification Search
None
See application file for complete search history.

(56) References Cited

U.S. PATENT DOCUMENTS

| 4,984,143 A | 1/1991 | Richardson |
| 5,126,886 A | 6/1992 | Richardson et al. |

(Continued)

FOREIGN PATENT DOCUMENTS

| CH | 526789 A | 8/1972 |
| DE | 19523351 A1 | 1/1997 |

OTHER PUBLICATIONS

European Extended Search Report; Application No. 18192008.3; dated Oct. 24, 2018; 13 pages.

(Continued)

*Primary Examiner* — Elmito Breval
(74) *Attorney, Agent, or Firm* — Conley Rose, P.C.; Grant Rodolph; Brooks W Taylor

(57) ABSTRACT

A color wheel for use in an automated luminaire includes a transparent substrate and a patterned dichroic filter coating on the transparent substrate. The pattern includes a first region and a second region. The first region includes unconnected coated dots, most of the coated dots having a substantially equal first size. The coated dots vary in density from a lower density at a first end of the first region to a higher density at a second end of the first region. The second region includes a contiguous dichroic filter coating that includes unconnected uncoated holes, most of the uncoated holes having a substantially equal second size. The uncoated holes vary in density from a higher density at a first end of the second region to a lower density at a second end of the second region. The first end of the second region abuts the second end of the first region.

20 Claims, 8 Drawing Sheets

(51) Int. Cl.
  *G02B 26/00* (2006.01)
  *F21V 9/20* (2018.01)
  *F21W 131/406* (2006.01)
  *G02B 5/28* (2006.01)

(52) U.S. Cl.
  CPC ....... *F21W 2131/406* (2013.01); *G02B 5/201* (2013.01); *G02B 5/28* (2013.01)

(56) References Cited

U.S. PATENT DOCUMENTS

| | | |
|---|---|---|
| 5,980,066 A | 11/1999 | Belliveau et al. |
| 6,480,662 B1 | 11/2002 | Chai et al. |
| 2017/0234796 A1 | 8/2017 | Kuster et al. |

OTHER PUBLICATIONS

European Examination Report; Application No. 18192008.3; dated Jul. 24, 2019; 5 pages.

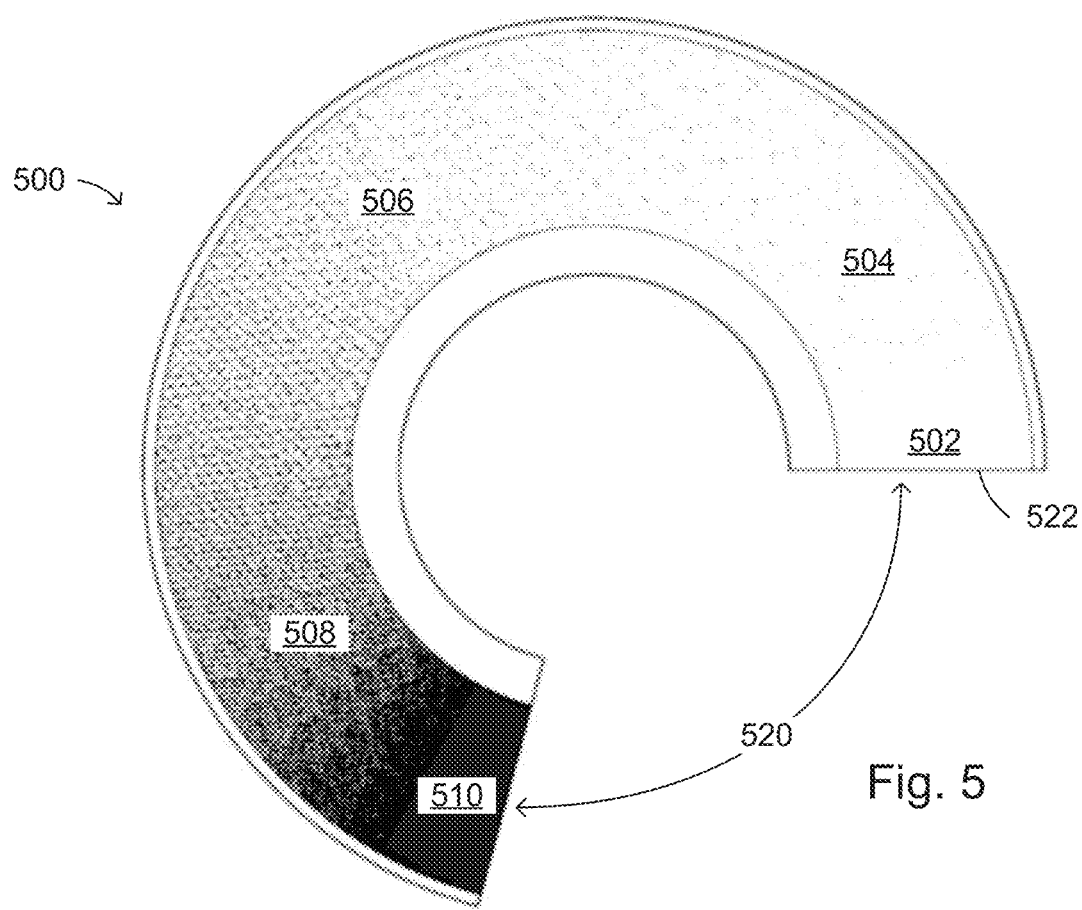
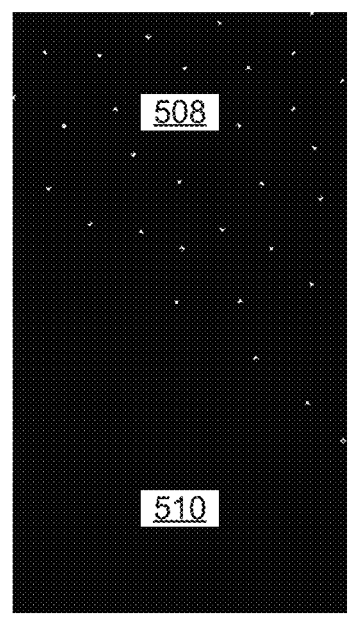
Fig. 6
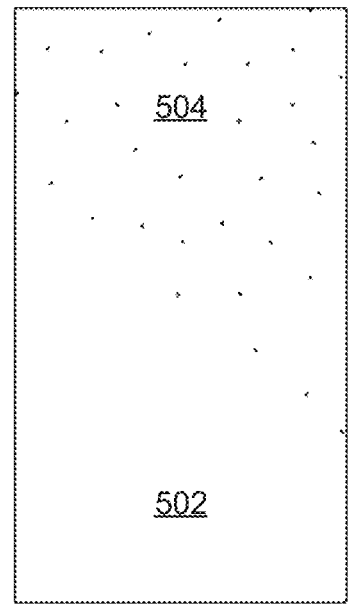
Fig. 7

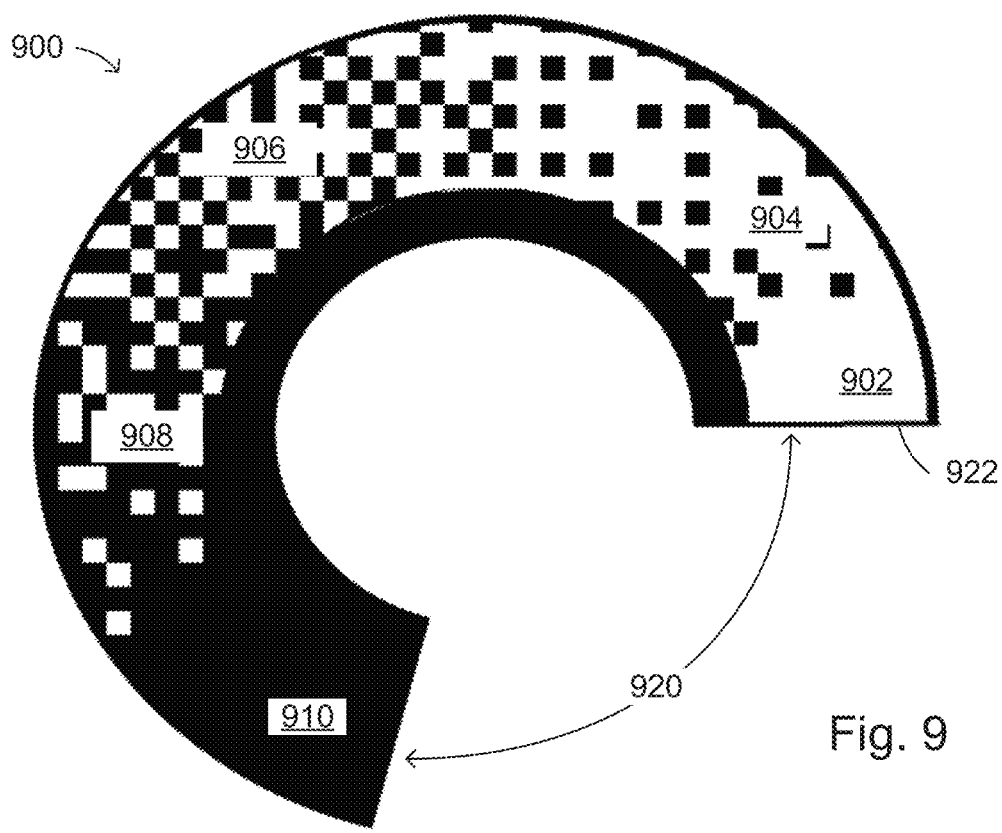
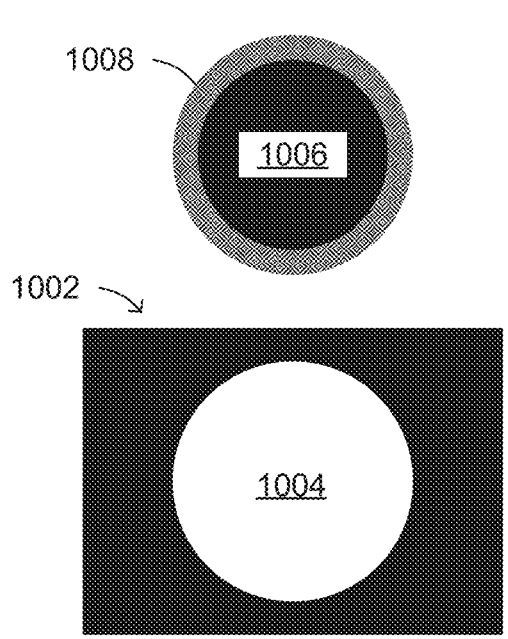
Fig. 10
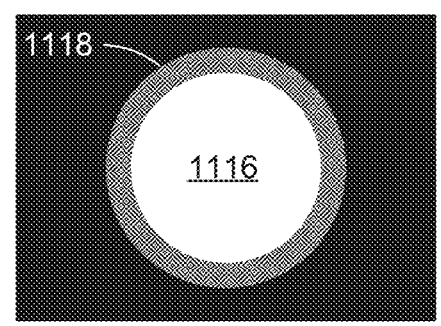
Fig. 11

DICHROIC PATTERNING FOR SUBTRACTIVE COLOR MIXING

CROSS-REFERENCE TO RELATED APPLICATIONS

This application claims priority to U.S. Provisional Application No. 62/553,769, filed Sep. 1, 2017 by Pavel Juřík, et al. entitled "Dichroic Patterning for Subtractive Color Mixing", which is incorporated by reference herein as if reproduced in its entirety.

TECHNICAL FIELD OF THE DISCLOSURE

The disclosure generally relates to an automated luminaire, specifically to optical components used for subtractive color control in an automated luminaire.

BACKGROUND

Luminaires with automated and remotely controllable functionality are well known in the entertainment and architectural lighting markets. Such products are commonly used in theatres, television studios, concerts, theme parks, night clubs, and other venues. As well as providing control over the pan and tilt functions of the luminaire, allowing an operator to control the direction the luminaire is pointing, automated luminaires often also provide control over a color of an emitted light beam. This color control may be provided via a subtractive color mixing process through the movement of color wheels, flags, or other similar colored filters. These colored filters may be graded from one end to the other with increasing saturation of the filter's color. By moving the filter partway into the light beam, a colored beam with varying saturation may be obtained. Combining two or more of these variable saturation filters one after the other in the optical train with different colors may be used to provide a variable color mixing system producing a wide gamut of colors.

SUMMARY

In a first embodiment, a color wheel for use in an automated luminaire includes a transparent substrate and a patterned dichroic filter coating on the transparent substrate. The pattern includes a first region and a second region. The first region includes unconnected coated dots, most of the coated dots having a substantially equal first size. The coated dots vary in density from a lower density at a first end of the first region to a higher density at a second end of the first region. The second region includes a contiguous dichroic filter coating that includes unconnected uncoated holes, most of the uncoated holes having a substantially equal second size. The uncoated holes vary in density from a higher density at a first end of the second region to a lower density at a second end of the second region. The first end of the second region abuts the second end of the first region. In a further embodiment, the pattern includes a third region of continuous dichroic coating that includes no uncoated holes, the third region abutting the second end of the second region.

In a second embodiment, an automated luminaire includes a light source, a color changing system, and a controller. The light source emits a light beam. The color changing system is optically coupled to the light source and configured to change a color of the light beam. The color changing system includes one or more color wheels. The controller is electrically coupled to the color changing system. The controller receives a control signal and positions the one or more color wheels to produce a specified color in the light beam in response to the control signal. At least one of the color wheels includes a transparent substrate and a patterned dichroic filter coating on the transparent substrate. The pattern includes a first region and a second region. The first region includes unconnected coated dots, most of the coated dots having a substantially equal first size. The coated dots vary in density from a lower density at a first end of the first region to a higher density at a second end of the first region. The second region includes a contiguous dichroic filter coating that includes unconnected uncoated holes, most of the uncoated holes having a substantially equal second size. The uncoated holes vary in density from a higher density at a first end of the second region to a lower density at a second end of the second region. The first end of the second region abuts the second end of the first region.

In a third embodiment, a color wheel for use in an automated luminaire includes a transparent substrate and a patterned dichroic filter coating on the transparent substrate. The pattern includes a region that has coated dots. Each coated dot has a substantially equal size and shape. A density of the coated dots varies from a lower density at a first end of the region to a higher density at a second end of the region.

BRIEF DESCRIPTION OF THE DRAWINGS

For a more complete understanding of this disclosure, reference is now made to the following brief description, taken in conjunction with the accompanying drawings in which like reference numerals indicate like features.

FIG. 5 presents a front view of a color wheel according to a first embodiment of the disclosure;

FIGS. 6-8 present detail views of the color wheel of FIG. 5;

FIG. 9 presents a front view of a color wheel according to a second embodiment of the disclosure;

FIG. 10 depicts a mask and resulting coated dot according to the disclosure;

FIG. 11 depicts a mask and resulting uncoated dot according to the disclosure.

DETAILED DESCRIPTION

Preferred embodiments are illustrated in the figures, like numerals being used to refer to like and corresponding parts of the various drawings.

Disclosed herein is an automated luminaire that includes a color changing system having at least one color wheel that includes a transparent substrate and a patterned dichroic filter coating on the transparent substrate. The pattern includes unconnected coated dots, each having a substantially equal size, and a contiguous dichroic filter coating with unconnected uncoated holes, each having a substantially equal size. The coated dots vary from low to high density in one region of the pattern. The uncoated holes vary from high density to low density in another region of the pattern.

FIGS. 1A-D present views of a prior art mechanism 100 for providing color filtration of varying saturation. A light beam (not shown) passes through an aperture 102. A filter 101 comprises a rectangular transparent substrate coated with a color filter material 103 having a saw tooth shape.

Figure 1A:
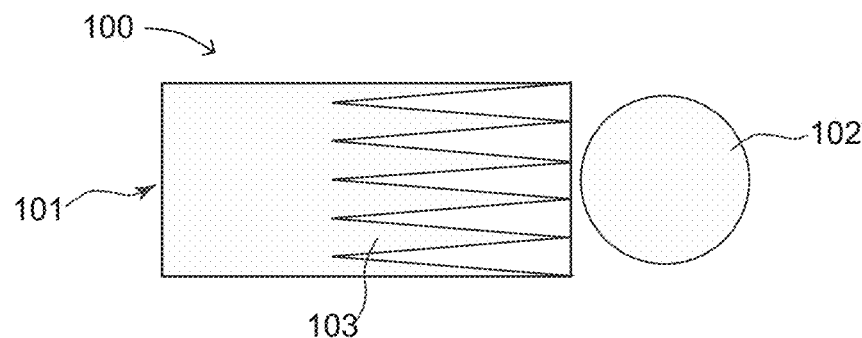
FIGS. 1A-D present views of a prior art mechanism for providing color filtration of varying saturation.

In FIG. 1A the filter 101 is completely removed from the aperture 102. As such, in the configuration shown in FIG. 1A, the filter 101 does not color the light beam passing through the aperture 102.

Figure 1B:
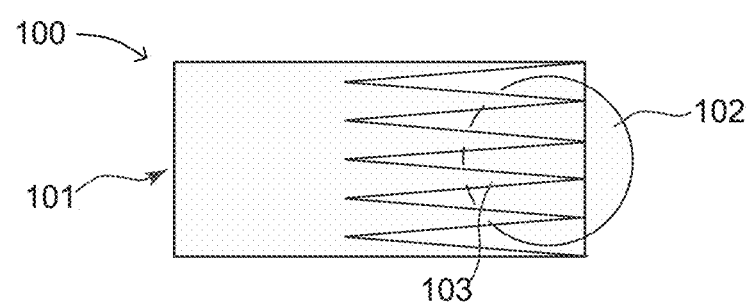

In FIG. 1B, the filter 101 has been moved partially into the aperture 102. Portions of the beam passing through the color filter material 103 will be colored, while portions of the beam passing through the transparent substrate of the filter 101, and those portions not passing through the filter 101, will not be colored.

Optical elements of the automated luminaire through which the partially colored beam subsequently passes are typically configured to homogenize, or blend, the colored and uncolored portions of the beam to produce a beam with even color across the beam. As more of the beam is uncolored than is colored by the configuration shown in FIG. 1B, the color of the beam so produced would be characterized as a lightly saturated color.

Figure 1C:
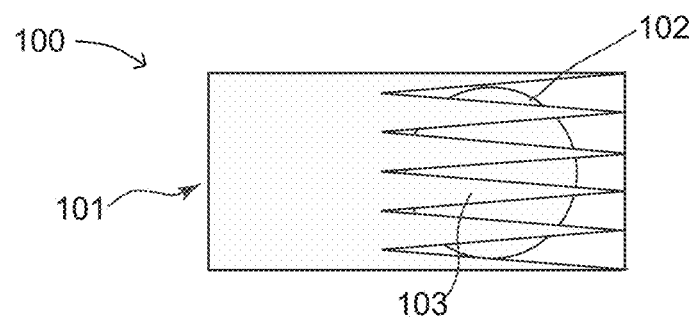

In FIG. 1C, the filter 101 has been moved father across the aperture 102, placing more of the color filter material 103 in the beam. This results in a larger portion of the beam being colored and a smaller portion being uncolored. Thus, the color of the beam produced by the configuration shown in FIG. 1C is characterized as a moderately saturated color.

Figure 1D:
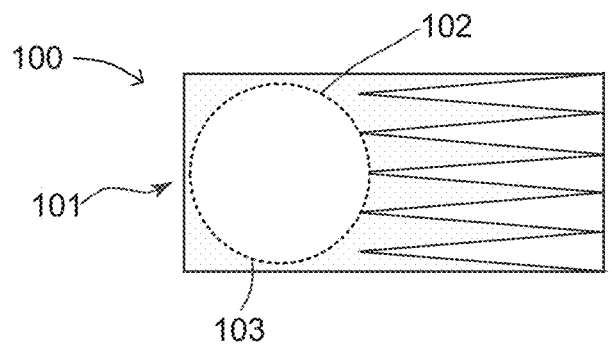

In FIG. 1D, the filter 101 has been moved so that the color filter material 103 completely covers the aperture 102. In this configuration, the entire beam passing through the aperture 102 is filtered and its color would be characterized as a fully saturated color.

While only a single color filter is depicted in FIGS. 1A-D, a typical automated luminaire would include three such color filter mechanisms, typically having cyan, yellow, and magenta filters, respectively. Through the operation of subtractive color mixing, three such mechanisms could be controlled by an operator of the automated luminaire to produce a desired color from a wide gamut of colors.

A problem with the prior art mechanism 100 is the smoothness and evenness of the color change. Despite subsequent homogenization, the leading edge of filter 101 and the etched fingers of the color filter material 103 may be visible in the resultant light beam, instead of being smoothly homogenized across the image. Similarly, the transition between the end of the pattern and the fully coated region of the filter 101 may also be visible. Fast optical projection systems exacerbate this problem. Other prior art systems have attempted to alleviate this problem by using finer patterns and/or patterns of dots that increase in size until they connect with each other. However, the transition areas in such systems are still often visible, and the tolerances of the etch processes, wet etch, or laser ablation that is used to produce such a pattern provide a lower limitation on the pattern size. Finally, both wet etch and laser ablation processes damage the dichroic coating at the edges of the pattern. The smaller the elements of the pattern, the more visible such coating damage may become, either in the projected pattern or in the perceived color of the filter.

Figure 2A:
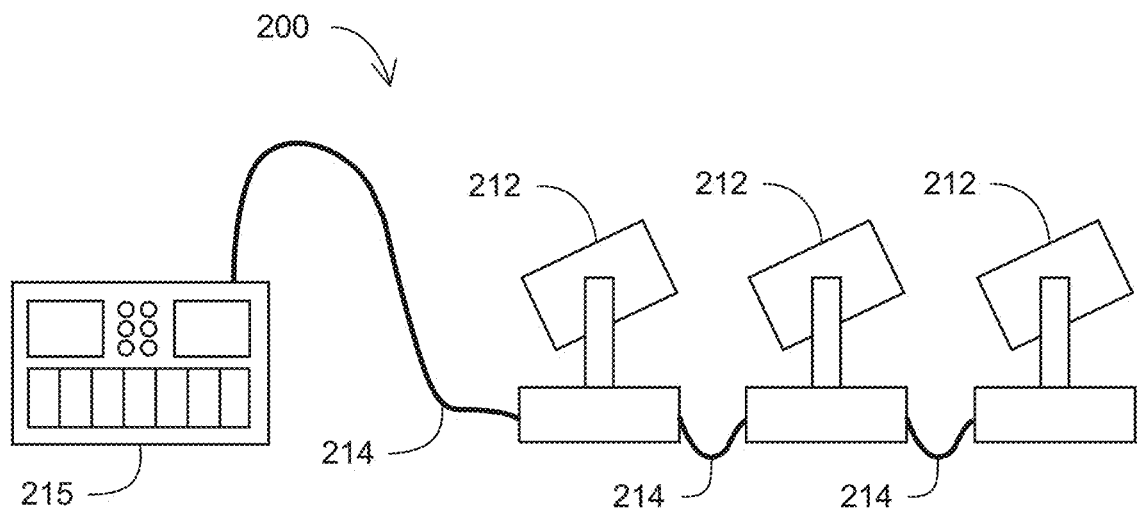
FIG. 2A presents a system including automated luminaires according to the disclosure.

FIG. 2A presents a system 200 including automated luminaires according to the disclosure. The system 200 includes a plurality of multiparameter automated luminaires 212 which each includes a light source configured to emit a light beam, light modulation devices coupled to the light source and configured to modify the emitted light beam, electric motors coupled to mechanical drives systems for the light modulation devices and for positioning of the luminaire head, as well as control electronics coupled to (and configured to control) the light source, the light modulation devices, and the electric motors. In addition to being connected to mains power either directly or through a power distribution system, each automated luminaire 212 is connected is series or in parallel via a data link 214 to one or more control desks 215. The luminaire system 200 is typically controlled by an operator through the control desk 215.

Figure 2B:
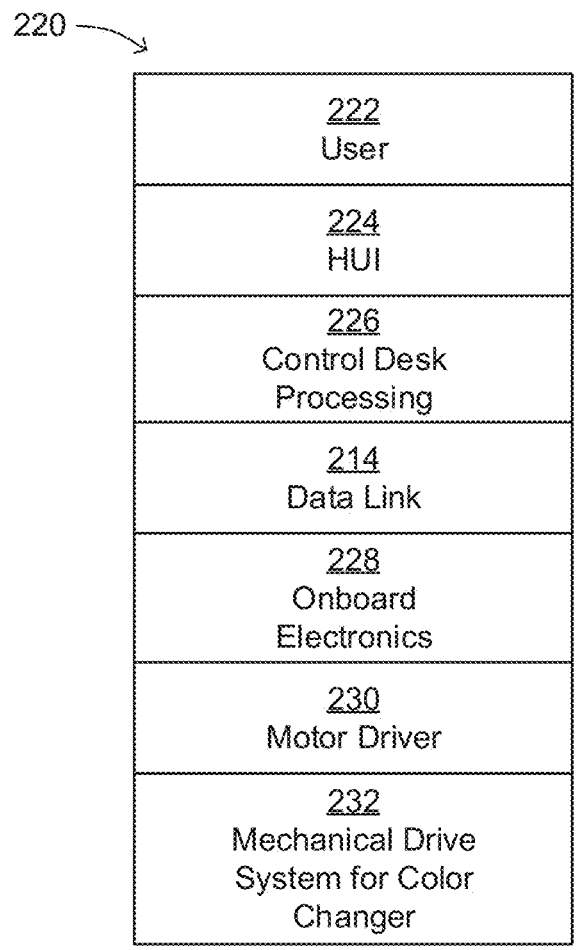
FIG. 2B presents control levels for the color parameter of an automated luminaire.

FIG. 2B presents control levels 220 for the color parameter of an automated luminaire. The first level of control is a user 222 who decides what they want and inputs information into the control desk 215 through a computer human user interface (HUI) 224. The control desk hardware and software then processes 226 the information and sends a luminaire control signal to the luminaire via the data link 214. The luminaire control signal is received and recognized by on-board electronics 228 of the automated luminaire 212. The onboard electronics 228 typically include a motor driver 230 for one or more motors controlling the color mechanisms. The motor driver 230 converts a color control signal from the onboard electronics 228 into electrical signals that drive the movement of the one or more color motors.

The one or more color motors are part of a color mechanical drive system 232 and move the mechanical components of the color mechanisms that cause a light beam emanating from the luminaire to change color. In some embodiments, the color mechanical drive system 232 uses a single motor or a pair of motors connected to the color change mechanism through a belt drive, a direct geared system. In other embodiments the motor is connected to the color change mechanism using a direct drive mechanism.

In some embodiments, the motor driver 230 is in the control desk 215 rather than in the automated luminaire 212, and the electrical signals which drive the motor are transmitted via the data link 214 directly to the automated luminaire 212. In other embodiments, the motor driver 230 is integrated into the onboard electronics 228. The data link 214 may employ any of several suitable protocols for communication between the control desk 215 and the automated luminaires 212. In many embodiments, the data link 214 is a serial data link. In such embodiments, the data link 214 uses an industry standard RS485-based serial protocol commonly referred to as DMX-512. Other embodiments may use other protocols, including but not limited to Art-Net, ACN (Architecture for Control Networks), and Streaming ACN.

Figure 3:
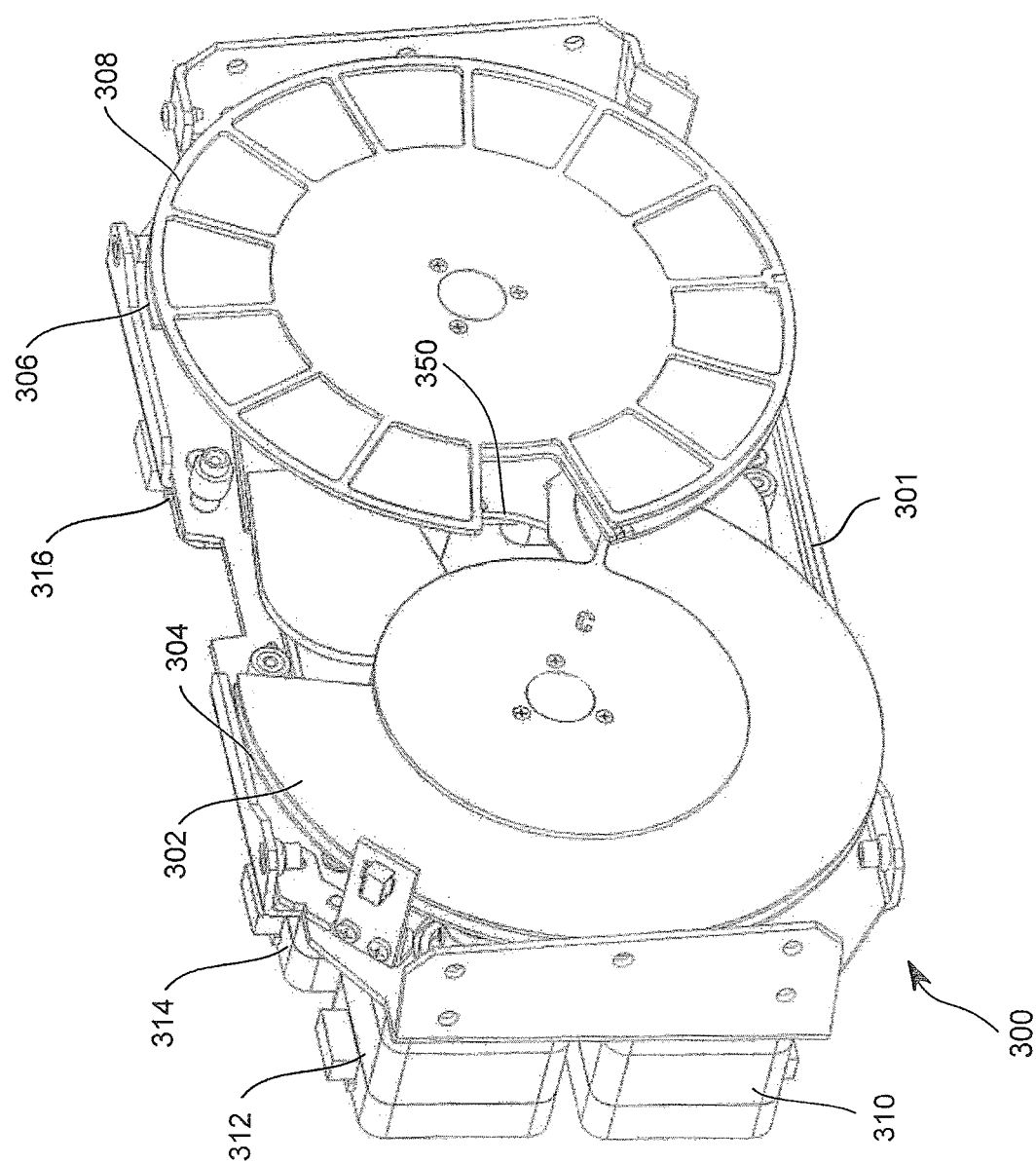
FIGS. 3 and 4 present front and back isometric views of a color changing system according to the disclosure.
Figure 4:
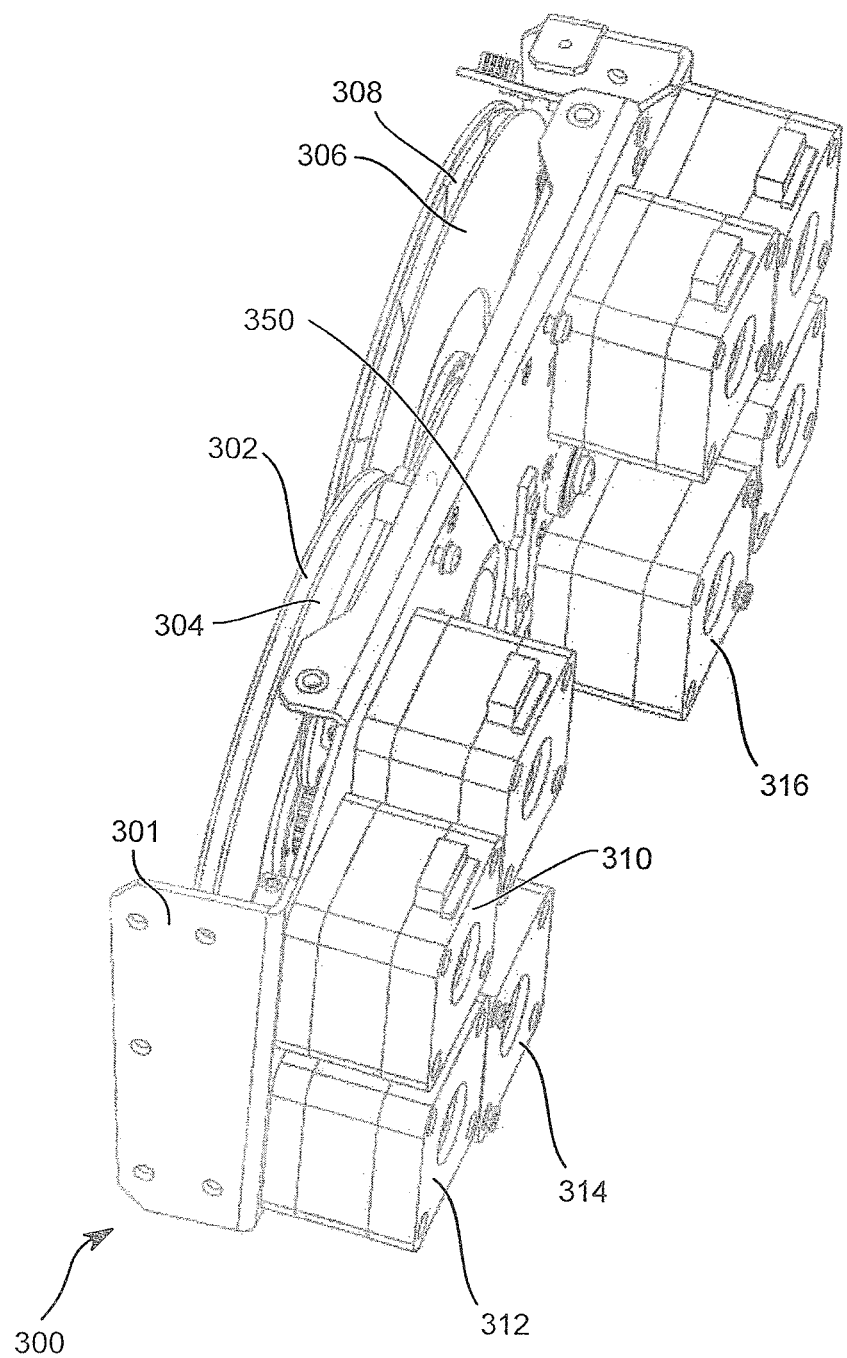

FIGS. 3 and 4 present front and back isometric views of a color changing system 300 according to the disclosure. The color changing system 300 is suitable for use in automated luminaires 212 according to the disclosure as described with reference to FIG. 2. Attached to a rigid mounting frame 301 are motors 310, 312, 314, and 316. In various embodiments, the type of motors used may include, but is not limited to, stepper motors, direct current (DC) motors, alternating current (AC) motors, or other suitable motors. The motors 310, 312, 314, and 316 respectively drive the rotation of color wheels 302, 304, and 306, and discrete color wheel 308. Color wheels 302, 304, and 306, and discrete color wheel 308, may be driven directly by motors 310, 312, 314, and 316, or may be driven through belts, gearing, or other mechanical drive systems.

Using the color wheel 302 as an example, the wheel 302 may be rotated so that a portion of the wheel 302 is positioned across a light beam passing through an optical aperture 350 of the automated luminaire 212. As is described below with reference to FIGS. 5-9, the portion of the wheel 302 positioned across the aperture 350 may be a cutaway portion of the wheel or a portion comprising only a clear substrate, a portion completely covered by a dichroic filter coating, or a portion in between, where the dichroic filter coating is patterned. As the light beam passes through the wheel 302, it is colored to a saturation that is dependent on the percentage of the dichroic filter coating through which it passes.

Color wheels 304 and 306 operate in a similar manner, such that the light emitted from the color changing system 300 is a subtractive mix of the colors introduced by all three wheels. Color wheels 302, 304 and 306 may comprise one each of the colors cyan, yellow, and magenta. Various embodiments may utilize any order of the colors on the wheels.

Using the colors cyan, magenta, and yellow allows an operator at the control desk 215 to send signals to onboard electronics 228 to cause the motor driver 230 to operate the mechanical drive system 232 for the color wheels 302, 304 and/or 306 to mix a desired color within a gamut from pale pastels to deep saturated colors using the process of subtractive color mixing.

In other embodiments, more than three color wheels may be used. For example, a fourth color wheel containing a CTO (Color Temperature Orange) filter may be added, which allows the user to adjust the color temperature of the light.

FIG. 5 presents a front view of a color wheel 500 according to a first embodiment of the disclosure. The color wheel 500 is suitable for use as any of the color wheels 302, 304 and/or 306 described with reference to FIGS. 3 and 4. The color wheel 500 is a partial wheel, extending from region 502 to region 510, but not through the arc 520. The color wheel 500 comprises a transparent substrate (depicted as white in the regions 502 through 508) with a patterned dichroic filter coating (depicted as black in the regions 504 through 510 and around the inner and outer peripheries of the color wheel 500). The bandpass characteristics of the dichroic filter coating determine the color of the color wheel 500 (e.g., cyan, magenta, or yellow). In other embodiments, a color wheel according to the disclosure may be a complete wheel, i.e., similar to the color wheel 500, but comprising uncoated transparent substrate in the arc 520.

Figure 8:
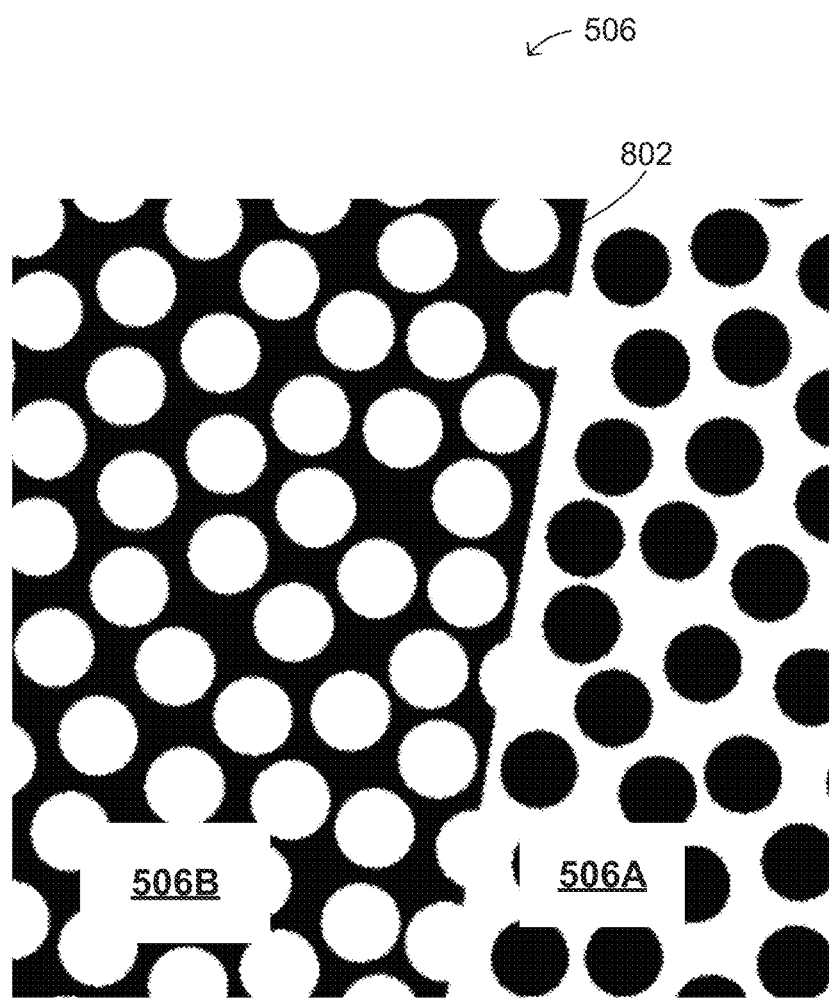

FIGS. 6-8 present detail views of the color wheel 500 of FIG. 5. FIG. 6 presents a detail view of the regions 508 and 510 of the color wheel 500. In the region 510, the dichroic filter coating is continuous, producing a light beam that is colored by the dichroic filter coating, the color of the light beam being fully saturated. In the region 508, the dichroic filter coating is contiguous and includes uncoated circular holes that are widely spaced (i.e., uncoated holes having a low density). The uncoated holes have a substantially equal nominal diameter (or size) of 46 micrometers (μm). For the purposes of this disclosure, the uncoated holes are of substantially equal size if their diameters are within 10% (or their areas are within 25%) of each other. The uncoated holes allow some unfiltered light to pass, resulting in a light beam whose color is deeply—but not fully—saturated.

FIG. 7 presents a detail view of the regions 502 and 504 of the color wheel 500. The region 502 is an uncoated region where the dichroic filter coating is absent, producing a light beam whose color is not changed by the color wheel 500. The region 504 comprises unconnected, circular dots of dichroic filter coating that are widely spaced, (i.e., coated dots having a low density), where all the coated dots have a substantially equal diameter (or size). The coated dots have a nominal diameter of 48 μm. Again, for the purposes of this disclosure, the coated dots are of substantially equal size if their diameters are within 10% (or their areas are within 25%) of each other. The coated dots filter some of the passing light, resulting in a light beam whose color is very lightly saturated.

In other embodiments, coated dots and uncoated holes in the diameter range 27 μm dots/26 μm holes to 90 μm dots/88 μm holes may be used. In yet other embodiments of the disclosure, larger or smaller uncoated holes and coated dots may be employed, depending upon characteristics of an optical system used with the color wheel according to the disclosure. A maximum size for the holes and dots may be set by a resolution of the optical system. Thus, in still other embodiments, coated dots and uncoated holes in the diameter range 20 μm to 200 μm may be used. In embodiments where larger coated dots and uncoated holes are used, other fabrication techniques than optical lithography (including but not limited to etching or laser ablation) may be used to fabricate color wheels according to the disclosure.

In some embodiments, the region 504 may extend all the way to edge 522 of the color wheel 500. In such embodiments, the wheel is rotated to remove the color wheel 500 from the light beam to produce a light beam whose color is not changed by the color wheel 500

FIG. 8 presents a detail view of the region 506 of the color wheel 500. The region 506 forms a transition zone between the coated dots of the region 504 and the uncoated holes of the region 508. The region 506 comprises regions 506A and 506B. An edge 802 of the contiguous dichroic filter coating surrounding the uncoated dots of the region 506B lies upon a radius of the color wheel 500 and forms a parting line between the regions 506A and 506B.

FIG. 8 presents the uncoated holes and the coated dots shown in FIGS. 6 and 7, respectively, but at a higher magnification. The coated dots in region 506A have substantially the same size as the coated dots in the region 504, but are more closely spaced (i.e., have a high density) while remaining unconnected with neighboring coated dots. The density of the coated dots in the patterned dichroic filter coating of the color wheel 500 increases non-linearly from a lower density in the region 504 to a higher density in the region 506A. In other embodiments, the density of coated dots may increase linearly from the region 504 to the region 506A.

Similarly, the uncoated holes in region 506B have substantially the same size as the uncoated holes in the region 508, but are more closely spaced (i.e., have a high density) while remaining unconnected with neighboring uncoated holes. The density of the uncoated holes in the patterned dichroic filter coating of the color wheel 500 decreases non-linearly from a higher density in the region 506B to a lower density in the region 508. In other embodiments, the density of coated dots may decrease linearly from the region 506B to the region 508.

In the regions 504 and 506A, the coated dots vary in density from lower density in the region 504 to higher density in 506A, but they are positioned not to contact each other in either region. Similarly, in the regions 506B and 508, the uncoated holes vary in density from higher density in the region 506B to lower density in 508, but they too are positioned not to contact each other in either region.

In the embodiment described with reference to FIGS. 5-8, the coated holes of the regions 504 and 506A and the uncoated holes of the regions 506B and 508 have a circular shape. In other embodiments, some or all of the coated dots and/or uncoated holes may have other shapes—for example, square, triangular, or a shape formed by two or more shapes overlapping. In some embodiments, coated dots and/or uncoated holes may include differing shapes on a single color wheel, where most (i.e., 50% or more) of the varied shapes have a substantially equal size (i.e., areas within 50% of each other).

The region 506A comprises dichroic filter coating in the coated dots and transparent substrate in the area between the coated dots. The region 506A may be characterized by a first proportion of dichroic filter coating in the coated dots to uncoated transparent substrate in the area between the coated dots. The region 506B comprises transparent substrate in the uncoated holes and dichroic filter coating in the area between the uncoated holes. The region 506B may be characterized by a second proportion of dichroic filter coating in the area between the uncoated holes to uncoated transparent substrate in the uncoated holes. In some embodiments, the first proportion is substantially equal to the second proportion, where substantially equal means the first and second proportions are within 10% of each other.

In some embodiments, the uncoated holes in the region 506B may contact or overlap the parting line 802, merging with the uncoated transparent substrate in the area between the coated dots in the region 506A, while the coated dots in the region 506A do not contact or overlap the parting line 802. In other embodiments, the coated dots in the region 506A contact or overlap the parting line 802 and merge with the dichroic filter coating in the area between the uncoated holes in the region 506B. In still other embodiments, the uncoated holes in the region 506B do not contact or overlap the parting line 802.

In some embodiments, the coated dots in the regions 504 and 506A do not contact the dichroic filter coating on either the inner or outer peripheries of the color wheel 500. In other embodiments, the coated dots in the regions 504 and 506A do contact the dichroic filter coating on one or both of the inner and outer peripheries of the color wheel 500.

FIG. 9 presents a front view of a color wheel 900 according to a second embodiment of the disclosure. The color wheel 900 is suitable for use as any of the color wheels 302, 304 and/or 306 described with reference to FIGS. 3 and 4. Like the color wheel 500 described with reference to FIG. 5, the color wheel 900 is a partial wheel, extending from region 902 to region 910, but not through the arc 920. The color wheel 900 comprises a transparent substrate (depicted as white in the regions 902 through 908) with a patterned dichroic filter coating (depicted as black in the regions 904 through 910 and around the inner and outer peripheries of the color wheel 900). In other embodiments, a color wheel according to the disclosure that is similar to the color wheel 900 may be a complete color wheel, comprising uncoated transparent substrate in the arc 920.

The region 902 includes no dichroic filter coating, the regions 904, 906, and 908 include square coated dots of increasing density, and the region 910 includes a continuous dichroic filter coating. The region 904 includes a minority of square coated dots and a majority of transparent substrate areas interspersed with the square coated dots (a low density of square coated dots). The region 906 indicates a transition zone to a majority of square coated dots and a minority of transparent substrate areas in the region 908 (a high density of square coated dots). As was described with reference to the color wheel 500 of FIG. 5, the region 904 may extend all the way to edge 922 of the color wheel 900.

Because of the geometry of square dots and square holes, they can cover the regions 904, 906, and 908 of the color wheel 900 with no gaps between dots; therefore, no parting line is required for the transition in the region 906 from a minority to a majority of square coated dots. Coated dots and uncoated holes shaped as rectangles, triangles, or hexagons share the same characteristic. Such square, rectangular, triangular, and hexagonal coated dots and uncoated holes are examples of a class of shapes that may be referred to as tessellation tiles.

The square coated dots in FIG. 9 have substantially the same shape and size as each other, that is, each side of any square is within 10% of the length of a neighboring side of the square and the dimensions of each square are within 10% of the dimensions of the other squares. Such a 10% variability in the sides of a square results in a 20% variability of area between squares. In other embodiments, triangular or hexagonal coated dots and uncoated holes may be used, and they too will have coated dots and uncoated holes of substantially the same shape and size.

The square coated dots and uncoated holes of the color wheel described with reference to FIG. 9 are 40 μm×40 μm. In other embodiments, square coated dots and uncoated holes of a color wheel according to the disclosure may be in the range 20 μm×20 μm to 200 μm×200 μm.

Unlike, the coated dots of the color wheel 500, some square coated dots of the color wheel 900 abut adjacent square coated dots, forming coated areas having a rectangular or other shape. In a second difference from the color wheel 500, some of the square coated dots contact the dichroic filter coating at the inner or outer periphery of the color wheel 900.

Because no parting line is require in the region 906, in some embodiments a color wheel according to the disclosure may include circular coated dots in the region 904, as described with reference to the color wheel 500 of FIG. 5. The circular coated dots transition to square coated dots in a region between the regions 904 and 906. Such an embodiment includes square coated dots as shown in the region 906 of FIG. 9. The majority square coated dots transition to circular uncoated dots in a region between the regions 906 and 908. As described with reference to the color wheel 500 of FIG. 5, the circular uncoated dots in the region 908 of such an embodiment decrease in density and the region 910 is a region of continuous dichroic filter material.

As described with reference to the transition from the region 506A to the region 506B, in the region between the regions 904 and 906, where the circular coated dots transition to square coated dots, a proportion of dichroic filter coating in the coated dots to uncoated transparent substrate in the area between the coated dots is substantially equal to a proportion of dichroic filter coating in the square coated dots to uncoated transparent substrate in the area not covered by square coated dots. Substantially equal proportions of dichroic filter coating to uncoated transparent substrate are also maintained in the region between the regions 906 and 908 where the majority square coated dots transition to the circular uncoated dots. Again, for the purposes of this disclosure, substantially equal means the proportions are within 10% of each other.

FIG. 10 depicts a circular mask 1002 and resulting circular coated dot 1006 according to the disclosure. While FIG. 10 shows a single mask hole, it will be understood that a mask used to create the regions 504 and 506A of the color wheel 500, for example, will include many such mask holes. In a process commonly known as photolithography, a sacrificial mask layer is created on the surface of the transparent substrate of a color wheel. The mask layer has a pattern of holes that is an inverse of the dichroic filter pattern that is to be applied to the color wheel. A dichroic filter coating is applied over the mask and its holes, and then the mask and the filter coating covering it are washed away with a solvent solution, leaving the transparent substrate with a dichroic filter coating in the desired pattern.

Thus, the mask 1002 includes a hole 1004 and, after the mask 1002 is washed away, the coated dot 1006 remains. Surrounding the coated dot 1006 is an edge zone 1008 of dichroic filter material that has been altered, to some degree, by the process of washing away the mask 1002. Light passing through this edge zone may be filtered to a different color than light passing through the coated dot 1006. Thus, the presence of edge zones around all the coated dots in the patterned dichroic filter coating on a color wheel according to the disclosure may cause the color wheel to have a different overall color filter characteristic than the filter characteristic of the dichroic filter material itself.

The impact of the edge zones on the overall color filter characteristic of the color wheel may be minimized in at least two ways. First, circular dots may be used, which have a smaller ration of edge zone area to dot area than other geometrical shapes. However, as described above with reference to FIGS. 5-8, one or more other shapes may also be used in other embodiments. Second, the dots may be made as large as is appropriate for the optical system in which the color wheel is being used. The edge zone will extend into the coated dot to a constant distance that is dependent on the dichroic filter material and the photolithography process, and thus the edge zone will represent a smaller proportion of larger coated dots and a greater proportion of smaller coated dots.

FIG. 11 depicts a circular mask 1112 and resulting circular uncoated hole 1116 according to the disclosure. While FIG. 11 shows a single mask dot, it will be understood that a mask used to create the regions 506B and 508 of the color wheel 500, for example, will include many such mask dots. The mask dot 1112 is applied to the transparent substrate of the color wheel, a dichroic filter coating is applied over the mask and exposed transparent substrate, and the mask dot 1112 is washed away. This leaves the uncoated hole 1116 in a field of dichroic filter coating.

As described for the coated dot 1006 of FIG. 10, the dichroic filter coating surrounding the uncoated hole 1116 includes an edge zone 1118. In order to fabricate an edge zone 1118 that is substantially the same size as the edge zone 1008, the mask dot 1112 is smaller than the mask hole 1004. As a result, the diameter of the uncoated hole 1116 (which does not include the edge zone 1118) is smaller than the diameter of the coated dot 1006 (which does include the edge zone 1008).

In embodiments where coated dots and/or uncoated holes having shapes other than a circle are used, relative sizes between dots and holes may be chosen to produce edge zones around the shapes that have substantially the same size, as described above for circular dots and holes.

Figure 12:
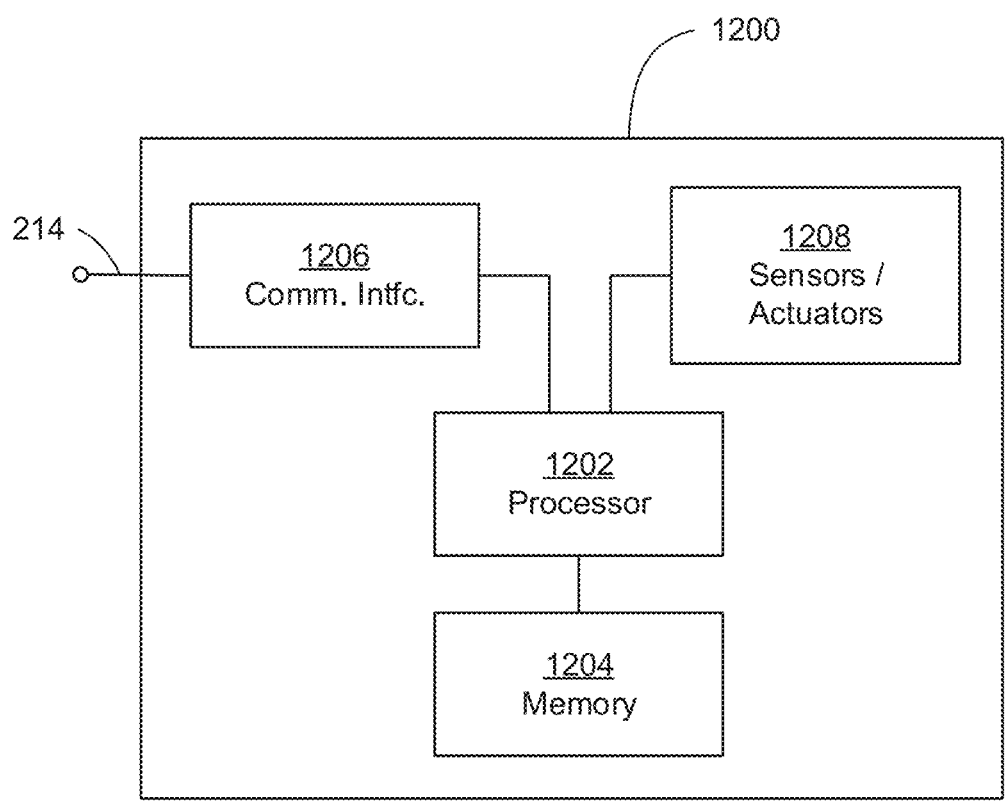
FIG. 12 presents a block diagram of a control system for an automated luminaire according to the disclosure.

FIG. 12 presents a block diagram of a control system (or controller) 1200 for an automated luminaire 212 according to the disclosure. The control system 1200 is suitable for use as the onboard electronics 228 described with reference to FIG. 2B for controlling the color changing system 300 described with reference to FIGS. 3 and 4. The control system 1200 is also suitable for controlling other control functions of the automated luminaire 212, described with reference to FIG. 2A. The control system 1200 includes a processor 1202 electrically coupled to a memory 1204. The processor 1202 is implemented by hardware and software. The processor 1202 may be implemented as one or more Central Processing Unit (CPU) chips, cores (e.g., as a multi-core processor), field-programmable gate arrays (FPGAs), application specific integrated circuits (ASICs), and digital signal processors (DSPs).

The processor 1202 is further electrically coupled to and in communication with a communication interface 1206. The processor 1202 is also coupled via control interface 1208 to one or more other sensors, motors, actuators, controls and/or other devices. The communication interface 1206 is coupled to, and configured to communicate via, the data link 214. The processor 1202 is configured to receive control signals via the communication interface 1206 and to control the color changing system 300 and other mechanisms of the automated luminaire 212 via the control interface 1208.

The control system 1200 is suitable for implementing processes, color mechanism control, and other functionality as disclosed herein, which may be implemented as instructions stored in the memory 1204 and executed by the processor 1202. The memory 1204 comprises one or more disks, tape drives, and/or solid-state drives and may be used as an over-flow data storage device, to store programs when such programs are selected for execution, and to store instructions and data that are read during program execution. The memory 1204 may be volatile and/or non-volatile and may be read-only memory (ROM), random access memory (RAM), ternary content-addressable memory (TCAM), and/or static random-access memory (SRAM).

While the disclosure has been described with respect to a limited number of embodiments, those skilled in the art, having benefit of this disclosure, will appreciate that other embodiments may be devised which do not depart from the scope of the disclosure herein. While the disclosure has been described in detail, it should be understood that various changes, substitutions and alterations can be made hereto without departing from the spirit and scope of the disclosure.

What is claimed is:

1. A color wheel for use in an automated luminaire, the color wheel comprising:
    a transparent substrate; and
    a patterned dichroic filter coating on the transparent substrate, the pattern including:
        a first region, comprising unconnected coated dots, most of the coated dots having a substantially equal first size, a density of the coated dots varying from a lower density at a first end of the first region to a higher density at a second end of the first region; and
        a second region, comprising a contiguous dichroic filter coating that includes unconnected uncoated holes, most of the uncoated holes having a substantially equal second size, a density of the uncoated holes varying from a higher density at a first end of the second region to a lower density at a second end of the second region, the first end of the second region abutting the second end of the first region.

2. The color wheel of claim 1, wherein the pattern further includes a third region comprising a continuous dichroic coating including no uncoated holes, the third region abutting the second end of the second region.

3. The color wheel of claim 2, wherein the color wheel is a partial wheel extending from an uncoated region abutting the first end of the first region around to the third region.

4. The color wheel of claim 1, wherein a first proportion of dichroic filter coating to uncoated transparent substrate in the second end of the first region is substantially equal to a second proportion of dichroic filter coating to transparent substrate in the first end of the second region.

5. The color wheel of claim 1, wherein the first size of the coated dots is greater than the second size of the uncoated holes.

6. The color wheel of claim 1, wherein the density of the coated dots increases non-linearly from the first end of the first region to the second end of the first region and the density of the uncoated holes decreases non-linearly from the first end of the second region to the second end of the second region.

7. The color wheel of claim 1, wherein the coated dots and the uncoated holes have circular shapes and the first diameter of the coated dots and the second diameter of the uncoated holes are in the range 20 µm to 200 µm.

8. An automated luminaire, comprising:
a light source configured to emit a light beam;
a color changing system optically coupled to the light source and configured to change a color of the light beam emitted by the light source, the color changing system comprising one or more color wheels; and
a controller electrically coupled to the color changing system and configured to receive a control signal and to position the one or more color wheels to produce a specified color in the light beam emitted by the light source in response to the control signal,
at least one of the one or more color wheels comprising:
a transparent substrate; and
a patterned dichroic filter coating on the transparent substrate, the pattern including:
a first region, comprising unconnected coated dots, most of the coated dots having a substantially equal first size, a density of the coated dots varying from a lower density at a first end of the first region to a higher density at a second end of the first region; and
a second region, comprising a contiguous dichroic filter coating that includes unconnected uncoated holes, most of the uncoated holes having a substantially equal second size, a density of the uncoated holes varying from a higher density at a first end of the second region to a lower density at a second end of the second region, the first end of the second region abutting the second end of the first region.

9. The automated luminaire of claim 8, wherein a first proportion of dichroic filter coating to uncoated transparent substrate in the second end of the first region is substantially equal to a second proportion of dichroic filter coating to uncoated transparent substrate in the first end of the second region.

10. The automated luminaire of claim 8, wherein the pattern further includes a third region comprising a continuous dichroic coating including no uncoated dots, the third region abutting the second end of the second region.

11. The automated luminaire of claim 10, wherein the at least one of the one or more color wheels is a partial wheel extending from an uncoated region abutting the first end of the first region around to the third region.

12. The automated luminaire of claim 8, wherein the first size of the coated dots is greater than the second size of the uncoated holes.

13. The automated luminaire of claim 8, wherein the density of the coated dots increases non-linearly from the first end of the first region to the second end of the first region and the density of the uncoated holes decreases non-linearly from the first end of the second region to the second end of the second region.

14. A color wheel for use in an automated luminaire, the color wheel comprising:
a transparent substrate; and
a patterned dichroic filter coating on the transparent substrate, the pattern including a first region comprising coated dots and interspersed transparent substrate areas, each coated dot having a substantially equal size and shape, the shape of the coated dots configured to cover the region without gaps between the coated dots, a density of the coated dots varying from a lower density at a first end of the first region to a higher density at a second end of the first region.

15. The color wheel of claim 14, wherein the pattern further includes a second region comprising a continuous dichroic coating, the second region abutting the second end of the first region.

16. The color wheel of claim 15, wherein the color wheel is a partial wheel extending from an uncoated region abutting the first end of the first region around to the second region.

17. The color wheel of claim 14, wherein the coated dots have a substantially square shape.

18. The color wheel of claim 14, wherein one or more coated dots abut adjacent coated dots in the first region.

19. The color wheel of claim 14, wherein the density of the coated dots increases non-linearly from the first end of the first region to the second end of the first region.

20. The color wheel of claim 14, wherein the pattern further includes:
a third region, comprising unconnected coated dots, most of the coated dots having a substantially equal first size, a density of the coated dots varying from a lower density at a first end of the third region to a higher density at a second end of the third region, the second end of the third region abutting the first end of the first region; and
a fourth region, comprising contiguous dichroic filter coating that includes unconnected uncoated holes, most of the uncoated holes having a substantially equal second size, a density of the uncoated holes varying from a higher density at a first end of the fourth region to a lower density at a second end of the fourth region, the first end of the fourth region abutting the second end of the first region.

\* \* \* \* \*